(12) United States Patent
Otsuka et al.

(10) Patent No.: US 6,653,662 B2
(45) Date of Patent: Nov. 25, 2003

(54) SEMICONDUCTOR LIGHT-EMITTING DEVICE, METHOD FOR FABRICATING THE SAME, AND METHOD FOR DRIVING THE SAME

(75) Inventors: Nobuyuki Otsuka, Kawanishi (JP); Yoshiaki Hasegawa, Katano (JP); Gaku Sugahara, Nara (JP); Yasutoshi Kawaguchi, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/984,913

(22) Filed: Oct. 31, 2001

(65) Prior Publication Data
US 2002/0050596 A1 May 2, 2002

(30) Foreign Application Priority Data

Nov. 1, 2000 (JP) ......................................... 2000-334956
Apr. 16, 2001 (JP) ......................................... 2001-116387

(51) Int. Cl.[7] ............................ H01S 5/00; H01L 27/15; H01L 33/00; H01L 31/117; H01L 29/12
(52) U.S. Cl. ............................ 257/99; 257/79; 257/103; 257/613; 257/615; 372/43
(58) Field of Search ...................... 257/79, 99, 103, 257/613, 615; 372/43

(56) References Cited

U.S. PATENT DOCUMENTS

| 3,928,864 A | * | 12/1975 | Ferlin ........................... 357/17 |
| 5,189,496 A | * | 2/1993 | Kuwabara ...................... 257/79 |
| 6,052,400 A | * | 4/2000 | Nanbu et al. ................... 372/50 |

FOREIGN PATENT DOCUMENTS

| EP | 0332453 | * | 9/1989 |
| EP | 0411612 A2 | * | 6/1991 |
| JP | 1-181585 | * | 7/1989 |

\* cited by examiner

*Primary Examiner*—Eddie Lee
*Assistant Examiner*—Joseph Nguyen
(74) *Attorney, Agent, or Firm*—McDermott, Will & Emery

(57) ABSTRACT

The semiconductor light-emitting device of the present invention includes a first semiconductor layer of a first conductivity type formed substantially in a uniform thickness on a substrate and a second semiconductor layer of a second conductivity type formed substantially in a uniform thickness on the first semiconductor layer. The device further includes an active layer, formed substantially in a uniform thickness between the first semiconductor layer and the second semiconductor layer, for generating emission light. The device also comprises a first electrode for supplying a drive current to the first semiconductor layer and a second electrode for supplying a drive current to the second semiconductor layer. The device is adapted that the first or second electrode is a divided electrode comprising a plurality of conductive members spaced apart from each other.

7 Claims, 14 Drawing Sheets

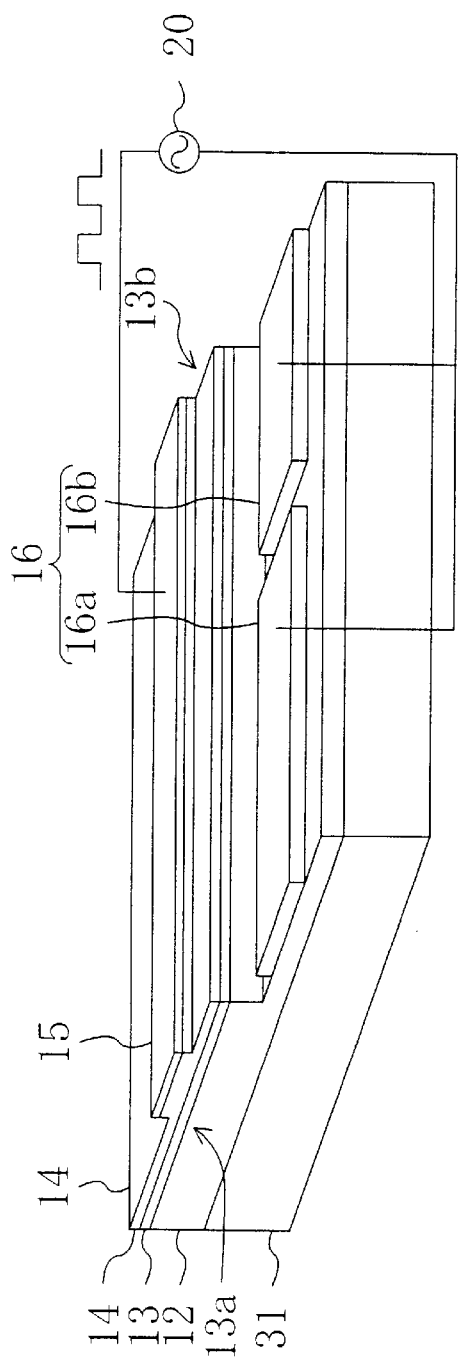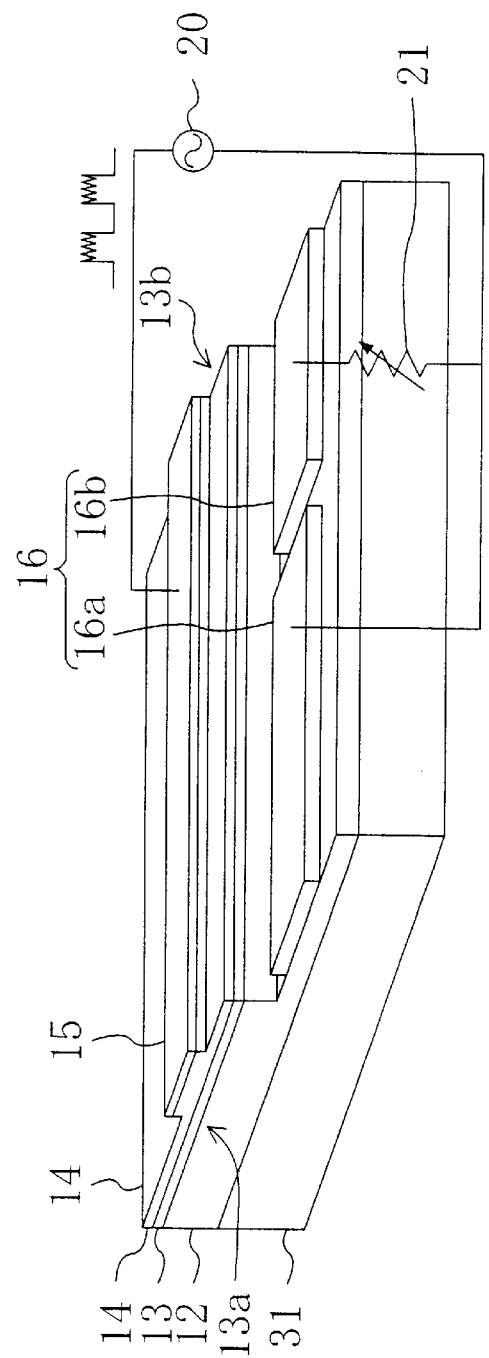

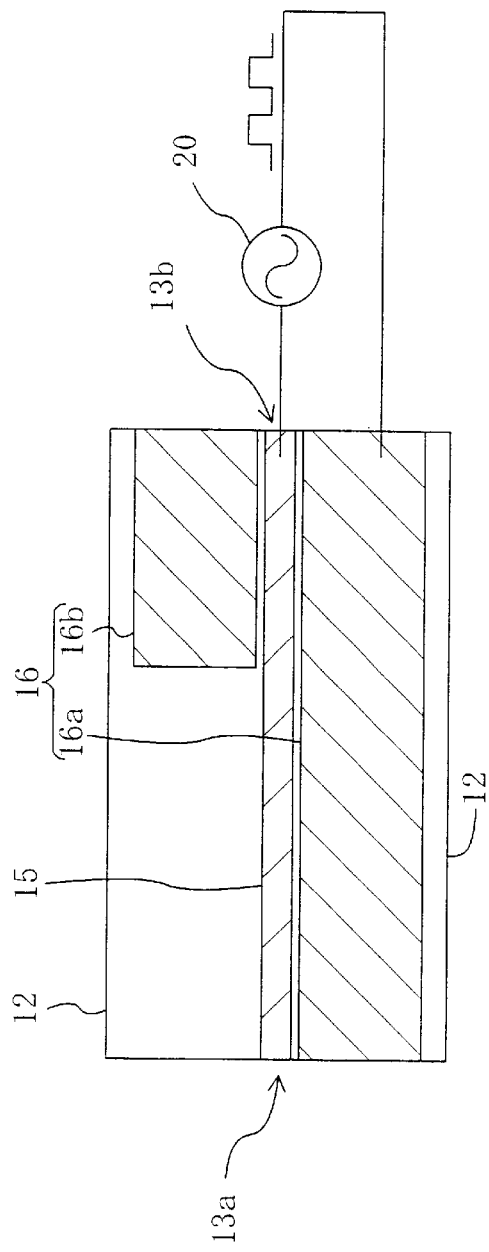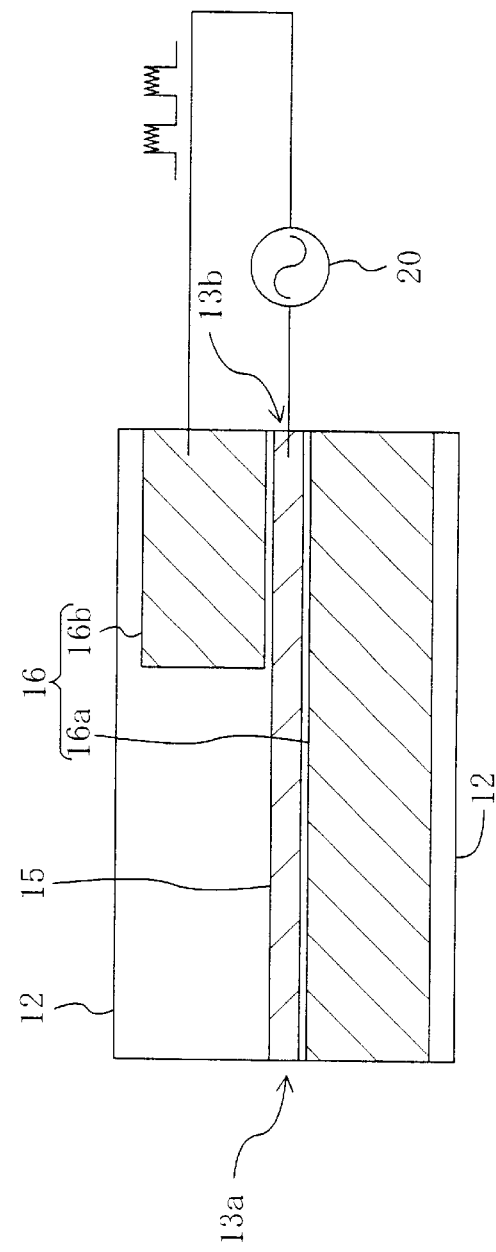

SEMICONDUCTOR LIGHT-EMITTING DEVICE, METHOD FOR FABRICATING THE SAME, AND METHOD FOR DRIVING THE SAME

BACKGROUND OF THE INVENTION

The present invention relates to a semiconductor light-emitting device which provides improved noise characteristics when operating at low output powers, and to a method for fabricating the light-emitting device, and a method for driving the same.

FIG. 14 shows a prior-art refractive index guided semiconductor laser device disclosed in Japanese Journal of Applied Physics by A. Kuramata et al., 37(1998), L1373.

For example, as shown in FIG. 14, on a substrate 101 of sapphire, formed are the following layers, each of which is formed of a III-V compound semiconductor. That is, grown by crystallization on the substrate 101 are an n-type semiconductor portion 102 containing an n-type contact layer, an active layer 103, and a p-type semiconductor portion 104 containing a p-type contact layer.

The upper portion of the p-type contact layer in the p-type semiconductor portion 104 has a ridge portion patterned in the shape of a stripe, where a p-side electrode 105 is formed on the entire surface of the ridge portion. In this structure, a region of the active layer 103 underlying the p-side electrode 105 acts as a cavity in which lasing takes place.

The n-type contact layer of the n-type semiconductor portion 102 is exposed on one side region of the p-side electrode 105, where an n-side electrode 106 is formed substantially on the entire surface of the exposed surface.

A forward drive current is applied from the p-side electrode 105 to the n-side electrode 106. When the drive current has exceeded a predetermined lasing current threshold, a laser beam is launched from one facet of the active layer 103.

Suppose that a semiconductor laser device like the one shown in FIG. 14 is used to perform a write operation on an optical disc such as a high-density digital versatile (or video) disc (HD-DVD). To use a purple laser beam in this operation, it is necessary to deliver an output of 30 mW or more. In contrast to this, it is necessary to make the output of the purple laser beam as low as 1 mW for the read operation.

However, in the read operation, there is a problem that the prior-art semiconductor laser device causes the relative intensity of noise to increase as the output decreases even when a high frequency is superimposed on the drive current. This is because a current approximately equal in magnitude to the lasing current threshold is injected to allow lasing to take place, thereby causing the relative intensity of noise to increase due to the effect of relaxation oscillation in the lasing.

In addition, lasing at approximately the same injected current as the lasing current threshold causes a characteristic of the single mode to be degraded and multi-mode components to develop, thereby increasing the relative intensity of noise.

To reduce the relative intensity of noise, it is necessary to increase the frequency of relaxation oscillation. As one of the methods that are applicable to the reduction, it is conceivable to increase the differential gain. To increase the differential gain of lasing, an optical absorption region may be formed to increase the lasing threshold.

Alternatively, the slope efficiency (differential efficiency) may be reduced to increase the current required to deliver a lasing output of approximately 1 mW, thereby setting the operating current to a value greater than the lasing threshold.

Incidentally, the facets of a cavity could be increased in reflectivity to reduce the noise of the semiconductor laser device. However, this would cause the output (optical output) of the laser beam to be reduced as well. As described above, lased light of a high output power is required for the HD-DVD device to carry out the write operation. Accordingly, this makes it impossible to employ the means for increasing the reflectivity of the facets, which leads to a reduction in optical output.

On the other hand, to allow the semiconductor laser device to provide self-pulsation, it is necessary to provide a semiconductor optical absorption layer in or near the active layer 103.

However, this raises a problem that such an optical absorption layer provided in the semiconductor laser device itself would make it difficult to provide a high output power.

SUMMARY OF THE INVENTION

It is therefore an object of the present invention to provide a semiconductor light-emitting device which solves the aforementioned prior-art problems and provides a reduced relative intensity of noise even when operating at low output powers.

To achieve the aforementioned object, the present invention provides a semiconductor laser device which is provided with the p-side or n-side electrode divided to apply a drive current to only part of a divided electrode when the laser device is required to operate at low output powers for the read operation.

More specifically, a semiconductor light-emitting device according to the present invention comprises a first semiconductor layer of a first conductivity type formed substantially in a uniform thickness on a substrate and a second semiconductor layer of a second conductivity type formed in a uniform thickness on the first semiconductor layer. The light-emitting device also comprises an active layer, formed in a uniform thickness between the first semiconductor layer and the second semiconductor layer, for generating emission light. The light-emitting device further comprises a first electrode for supplying a drive current to the first semiconductor layer and a second electrode for supplying a drive current to the second semiconductor layer. The light-emitting device is adapted such that the first electrode or the second electrode is a divided electrode comprising a plurality of conductive members spaced apart from each other.

According to the semiconductor light-emitting device of the present invention, a drive current is applied to all the divided electrodes for the operation at high output powers. On the other hand, for the operation at low output powers, a drive current is applied to part of the divided electrodes to inject the drive current nonuniformly into the active layer, thereby forming an optical absorption region in the active layer. This causes the lasing current threshold to increase and the differential gain of lasing to thereby increase, thus making it possible to reduce the relative intensity of noise during the operation at low output powers.

In the semiconductor light-emitting device according to the present invention, it is preferable that the divided electrode is provided on a principal surface, having said active layer formed thereon, of the substrate.

In the semiconductor light-emitting device according to the present invention, it is preferable that the second electrode has a stripe pattern for forming a cavity in the active layer, and the divided electrodes are adapted to sit on the sides of an emitting facet and a reflecting facet of the cavity, respectively.

In the semiconductor light-emitting device according to the present invention, it is preferable that the first electrode and the second electrode are formed on the principal surface, having the active layer formed thereon, of the substrate.

In the semiconductor light-emitting device according to the present invention, it is preferable that the divided electrode is a p-side electrode for injecting holes into the active layer.

In this case, it is preferable that the p-side electrode has a stripe pattern formed on the second semiconductor layer, and the plurality of conductive members of the p-side electrode are spaced apart approximately 10 $\mu$m or less from each other.

In the semiconductor light-emitting device according to the present invention, it is preferable that the divided electrode is an n-side electrode for injecting electrons into the active layer.

In this case, it is preferable that the n-side electrode is formed on a region of the first semiconductor layer, the region being exposed on one side of the p-side electrode, and the plurality of conductive members of the n-side electrode are spaced apart approximately 5 $\mu$m or more from each other.

In this case, it is also preferable that the second electrode is a p-side electrode having a stripe pattern formed on the second semiconductor layer and the n-side electrode comprises first and second electrode portions formed on a region of the first semiconductor layer, the region being exposed on one side of the p-side electrode. It is also preferable that a dividing region disposed between the first and second electrode portions is formed at an angle of inclination greater than 0° and less than 90° to a direction, within the plane of the substrate, perpendicular to the longitudinal direction of the p-side electrode.

In this case, it is also preferable that the second electrode is a p-side electrode having a stripe pattern formed on the second semiconductor layer and the first semiconductor layer is exposed on both sides of the p-side electrode. It is also preferable that the n-side electrode comprises a first electrode portion formed on a region of the first semiconductor layer on one side of the p-side electrode and a second electrode portion formed on a region of the-first semiconductor layer on the other side of the p-side electrode. It is further preferable that the first and second electrode portions are formed so as to be asymmetrical in their planar shapes with respect to the p-side electrode.

In the semiconductor light-emitting device according to the present invention, it is preferable that the substrate is conductive. It is also preferable that the divided electrode comprises a first electrode portion provided on the surface opposite to the principal surface of the substrate having the active layer formed thereon and a second electrode portion provided on the principal surface of the substrate having the active layer formed thereon.

In this case, it is preferable that the divided electrode is an n-side electrode and the first electrode portion is provided substantially on the entire surface opposite to the principal surface of the substrate. It is further preferable that the second electrode portion is provided on part of the region on a side of the p-side electrode, and the second electrode is a p-side electrode having a stripe pattern formed on the second semiconductor layer.

In the semiconductor light-emitting device according to the present invention, it is preferable that the active layer is formed of a compound semiconductor having a composition of nitrogen.

Furthermore, it is also preferable that the active layer is formed of a compound semiconductor having a composition of phosphor.

A method for fabricating a first semiconductor light-emitting device according to the present invention comprises the steps of:
  growing successively a first semiconductor layer of a first conductivity type, an active layer, and a second semiconductor layer of a second conductivity type, each substantially in a uniform thickness;
  exposing part of the first semiconductor layer to form then a first electrode on the first exposed semiconductor layer;
  forming a second electrode on the second semiconductor layer; and
  forming a divided electrode by isolating the first electrode or the second electrode electrically into a plurality of electrodes.

The method for fabricating the first semiconductor light-emitting device comprises the steps of forming the first electrode for supplying a drive current to the first semiconductor layer and the second electrode for supplying a drive current to the second semiconductor layer, and thereafter forming a divided electrode by electrically isolating the first or second electrode into a plurality of electrodes. This ensures it to provide the semiconductor light-emitting device of the present invention.

In the method for fabricating the first semiconductor light-emitting device, it is preferable that the step of forming a divided electrode employs an etching method.

In the method for fabricating the first semiconductor light-emitting device, it is also preferable that the step of forming a divided electrode employs a lift-off method.

A method for fabricating a second semiconductor light-emitting device according to the present invention comprises the steps of:
  growing successively a first semiconductor layer of a first conductivity type, an active layer, and a second semiconductor layer of a second conductivity type, each substantially in a uniform thickness;
  exposing part of the first semiconductor layer to form then a first n-side electrode on the first exposed semiconductor layer;
  forming a second n-side electrode on a surface opposite to a surface of the substrate having the active layer; and
  forming a p-side electrode on the second semiconductor layer.

According to the method for fabricating the second semiconductor light-emitting device, the n-side electrode is a divided electrode since the first n-side electrode is formed on the first semiconductor layer and the second n-side electrode is formed on the surface of the substrate opposite to the active layer. This ensures it to provide the semiconductor light-emitting device of the present invention.

In the method for fabricating the first or second semiconductor light-emitting device, it is preferable that the active layer is formed of a compound semiconductor having a composition of nitrogen.

In the method for fabricating the first or second semiconductor light-emitting device, it is preferable that the active layer is formed of a compound semiconductor having a composition of phosphor.

The present invention provides a method for driving a first semiconductor light-emitting device. The first semiconductor light-emitting device comprises a first semiconductor layer of a first conductivity type formed on a substrate and a second semiconductor layer of a second conductivity type formed on the first semiconductor layer. The light-emitting device also comprises an active layer, formed between the first semiconductor layer and the second semiconductor layer, for generating emission light. The light-emitting device further comprises a first electrode for supplying a drive current to the first semiconductor layer and a second electrode, having the shape of a stripe, for supplying a drive current to the second semiconductor layer. The first electrode or the second electrode is a divided electrode divided in the longitudinal direction of the second electrode, and the divided electrode comprises a first electrode portion located on the side of an emitting facet and a second electrode portion located on the side of a reflecting facet. The method comprises the step of applying a first drive current to the first electrode portion and the second electrode portion to increase a relative lasing output of a laser beam. The method also comprises the step of, to decrease a relative lasing output of a laser beam, applying the first drive current to the first electrode portion as well as applying a second drive current to the second electrode portion, the second drive current being less in magnitude than the first drive current, or applying no second drive current to the second electrode portion. Alternatively, the method comprises the step of, to decrease a relative lasing output of a laser beam, applying the first drive current to the second electrode portion as well as applying the second drive current to the first electrode portion, the second drive current being less in magnitude than the first drive current, or applying no second drive current to the second electrode portion.

According to the method for driving the first semiconductor light-emitting device, a current can be injected nonuniformly into the active layer for the operation at low output powers, thereby forming an optical absorption region in the active layer. This causes the lasing current threshold to increase and the differential gain of lasing to thereby increase, thus making it possible to reduce the relative intensity of noise during the operation at low output powers.

The present invention provides a method for driving a second semiconductor light-emitting device, the semiconductor light-emitting device comprising: a first semiconductor layer of a first conductivity type formed on a substrate, a second semiconductor layer of a second conductivity type formed on the first semiconductor layer, an active layer, formed between the first semiconductor layer and the second semiconductor layer, for generating emission light, a first electrode for supplying a drive current to the first semiconductor layer, and a second electrode, having the shape of a stripe, for supplying a drive current to the second semiconductor layer, wherein the first electrode or the second electrode is a divided electrode divided at an obverse surface and a reverse surfaces of the substrate, and the divided electrode comprising a first electrode portion which covers almost all a surface of the substrate opposite to a surface of the active layer and a second electrode portion located on the emitting face side or the reflecting facet side on the first semiconductor layer, the method comprising the steps of: to increase a relative lasing output of a laser beam, applying a first drive current to the first electrode portion, and to decrease a relative lasing output of a laser beam, applying the first drive current to the second electrode portion, and applying a second drive current to the first electrode portion or applying no second drive current to the second electrode portion, the second drive current being less in magnitude than the first drive current.

According to the method for driving the second semiconductor light-emitting device, a current can be injected nonuniformly into the active layer for the operation at low output powers, thereby forming an optical absorption region in the active layer. This causes the lasing current threshold to increase and the differential gain of lasing to thereby increase, thus making it possible to reduce the relative intensity of noise during the operation at low output powers.

In the method for driving the first or second semiconductor light-emitting device, it is preferable that the first drive current is allowed through resistance varying means to generate the second drive current.

In the method for driving the first or second semiconductor light-emitting device, it is preferable that the peak value of the second drive current is approximately one half the peak value of the first drive current.

The present invention provides a method for driving a third semiconductor light-emitting device. The third semiconductor light-emitting device comprises a first semiconductor layer of a first conductivity type formed on a substrate and a second semiconductor layer of a second conductivity type formed on the first semiconductor layer. The light-emitting device also comprises an active layer, formed between the first semiconductor layer and the second semiconductor layer, for generating emission light. The light-emitting device further comprises a first electrode for supplying a drive current to the first semiconductor layer and a second electrode, having the shape of a stripe, for supplying a drive current to the second semiconductor layer. The light-emitting device is adapted that the first electrode or the second electrode is a divided electrode divided in the longitudinal direction of the second electrode, and the divided electrode comprises a first electrode portion located on the side of an emitting facet and a second electrode portion located on the side of a reflecting facet. The method comprises the step of applying drive currents, different in magnitude from each other, to the first electrode portion and the second electrode portion so as to induce a self-pulsation.

According to the method for driving the third semiconductor light-emitting device, drive currents, different in magnitude from each other, are applied to the first electrode portion and the second electrode portion of the divided electrode so as to induce a self-pulsation. This allows the relative intensity of noise to be reduced without superimposing a high-frequency signal on the drive currents, thereby making it possible to simplify the drive circuit of the laser device.

In the method for driving the third semiconductor light-emitting device, it is preferable that no drive current is applied to any one of the first electrode portion and second electrode portion for self-pulsation.

The present invention provides a method for driving a fourth semiconductor light-emitting device. The third semiconductor light-emitting device is employed for reading information stored on a storage medium using a reflected beam of laser light emitted from the semiconductor light-emitting device having a lasing cavity. The method comprises the step of injecting a drive current nonuniformly into the cavity to read the stored information.

According to the method for driving the fourth semiconductor light-emitting device, a current can be injected nonuniformly into the active layer, thereby forming an optical absorption region in the active layer. This causes the lasing current threshold to increase and the differential gain of lasing to thereby increase, thus making it possible to reduce the relative intensity of noise for the operation at low output powers.

In the method for driving the fourth semiconductor light-emitting device, it is preferable that the semiconductor light-emitting device is self-pulsation type.

In the method for driving the fourth semiconductor light-emitting device, it is also preferable that the drive current is a high-frequency current.

In this case, it is preferable that the high-frequency current has a frequency of approximately 100 MHz or more.

Incidentally, among the prior-art semiconductor light-emitting devices, available is a laser device, having a divided electrode, like an integrated laser device such as a DBR (Distributed Bragg Reflector) laser device. However, the devices each corresponding to the divided electrodes have functions different from each other, and the crystal structure or the like in the lasing region is different from electrode to electrode.

Furthermore, to apply modulating currents to the prior-art laser device having divided electrodes, the currents applied are different from each other in magnitude, frequency, phase or the like. Furthermore, in the known laser structure having n-side electrodes formed on both sides of the p-side electrode, the n-side electrodes have the same length in the direction of lasing.

BRIEF DESCRIPTION OF THE DRAWINGS

FIGS. 6A and 6B are schematic perspective views illustrating a semiconductor laser device according to a third embodiment of the present invention and a method for driving the laser device;

FIGS. 9A and 9B are views illustrating a semiconductor laser device according to a fourth embodiment of the present invention and a first method for driving the laser device, FIG. 9A being a schematic plan view illustrating the laser device operated at a high power, FIG. 9B being a schematic plan view illustrating the laser device operating at low output powers;

DETAILED DESCRIPTION OF THE INVENTION

[Embodiment 1]

Now, the present invention will be explained below with reference to the accompanying drawings in accordance with a first embodiment.

Figure 1:
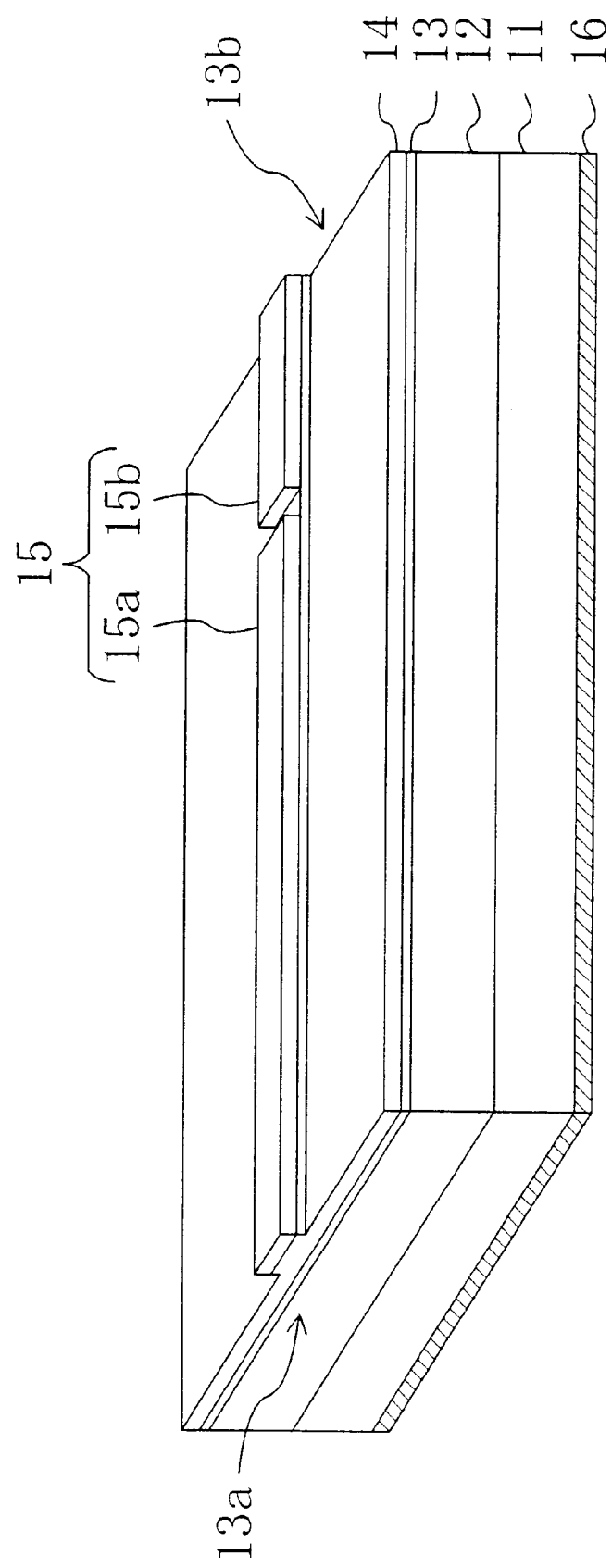
FIG. 1 is a perspective view illustrating a semiconductor laser device according to a first embodiment of the present invention.

FIG. 1 illustrates a semiconductor laser device according to a first embodiment of the present invention.

As shown in FIG. 1, for example, the following layers are epitaxially grown by MOVPE (metal organic vapor phase epitaxy) or the like on the principal surface of a conductive semiconductor substrate 11 of GaN (gallium nitride). That is, on the principal surface, grown are an n-type semiconductor portion 12, an active layer (a light-emitting layer) 13, and a p-type semiconductor portion 14.

From the side of the semiconductor substrate 11, the n-type semiconductor portion 12 contains an n-type contact layer of n-type GaN (gallium nitride), an n-type cladding layer of n-type AlGaN (aluminum gallium nitride), and an ntype guiding layer of n-type GaN (gallium nitride). Incidentally, a buffer layer of GaN (gallium nitride) may be provided as the bottom layer of the n-type semiconductor portion 12.

From the side of the active layer 13, the p-type semiconductor portion 14 contains a p-type guiding layer of p-type GaN (gallium nitride), a p-type cladding layer of p-type AlGaN (aluminum gallium nitride), and a p-type contact layer of p-type GaN (gallium nitride).

For example, the active layer 13 is formed of a III-V nitride semiconductor, such as InGaN (indium gallium nitride), which has a smaller bandgap energy than that of the n-type guiding layer and the p-type guiding layer. Incidentally, the active layer 13 may have a multiple quantum well structure.

For example, on top of the p-type semiconductor portion 14, provided is a p-side electrode 15 which is formed of a layered structure of Ni (nickel) and Au (gold) in the shape of a stripe approximately 1.8 to 2.5 $\mu$m in width. For example, the p-side electrode 15 is etched and thereby divided into a first electrode portion 15a on the side of an emitting facet 13a of the active layer 13 and a second electrode portion 15b on the side of the reflecting facet 13b.

The portions of the p-type contact layer of the p-type semiconductor portion 14 on both sides of the p-side electrode 15 are etched and thereby reduced in thickness to form an optical waveguide (a cavity) in the active layer 13. Accordingly, the region between the first and second electrode portions 15a, 15b in the p-type contact layer is not etched.

The first and second electrode portions 15a, 15b of the p-side electrode 15 are spaced apart approximately 1 μm from each other. In addition, the second electrode portion 15b is adjusted in length such that the laser device lases at a lasing current threshold two to three times that for operating at high output powers, for example, at approximately 100 mA. When the optical waveguide is approximately 0.5 mm in length, the second electrode portion 15b may have a length of approximately 0.1 mm.

There is provided an n-side electrode 16 on the surface opposite to the principal surface (on the reverse side) of the semiconductor substrate 11 on which the active layer 13 is formed, the n-side electrode 16 being formed of a layered structure of Ti (titan) and Al (aluminum).

The active layer 13 is substantially uniform in thickness over the entire region of the optical waveguide. Since the nitride semiconductor has a high differential gain, the active layer 13 nonuniform in thickness would provide nonuniform lased light when operating at high output powers by injecting a current into the p-side and n-side electrodes 15, 16. This would result in incapability of providing the desired laser beam intensity, and it is therefore necessary to make the active layer 13 uniform in thickness.

In the n-type semiconductor portion 12 and the p-type semiconductor portion 14, each semiconductor layer contained in these portions is made substantially uniform in thickness in the longitudinal direction of the optical waveguide (in the direction of emission).

In particular, since the nitride semiconductor provides a high resistance for a p-type semiconductor, the p-type semiconductor portion 14 that is nonuniform in thickness in the direction of emission would cause a drive current to be injected nonuniformly. This would result in providing insufficiently the desired optical output when the laser device operates at high output powers by injecting the current into the p-side and n-side electrodes 15, 16. To avoid this situation, each semiconductor layer constituting the n-type semiconductor portion 12 and the p-type semiconductor portion 14 is made substantially uniform in thickness in the direction of emission.

Incidentally, as described above, the first and second electrode portions 15a, 15b of the p-side electrode 15 are spaced apart approximately 1 μm from each other. When the first and second electrode portions 15a, 15b are spaced apart from each other by 10 μm or more, even a simultaneous injection of a drive current to the first and second electrode portions 15a, 15b would not make it possible to provide the desired lasing characteristic since a region into which not current is injected is formed in the active layer 13. It is therefore preferable that the first and second electrode portions 15a, 15b have the shortest possible spacing therebetween within the range in which no large current is allowed to flow.

As described above, the region between the first and second electrode portions 15a, 15b of the p-type contact layer remains unremoved. This is intended not to form a nonemitting region in the active layer 13, the region underlying between the first and second electrode portions 15a, 15b, when a drive current is injected into both the first and second electrode portions 15a, 15b.

Now, the operation of the semiconductor laser device configured as described above is described below with reference to the drawings.

[First Driving Method]

Figure 2A:
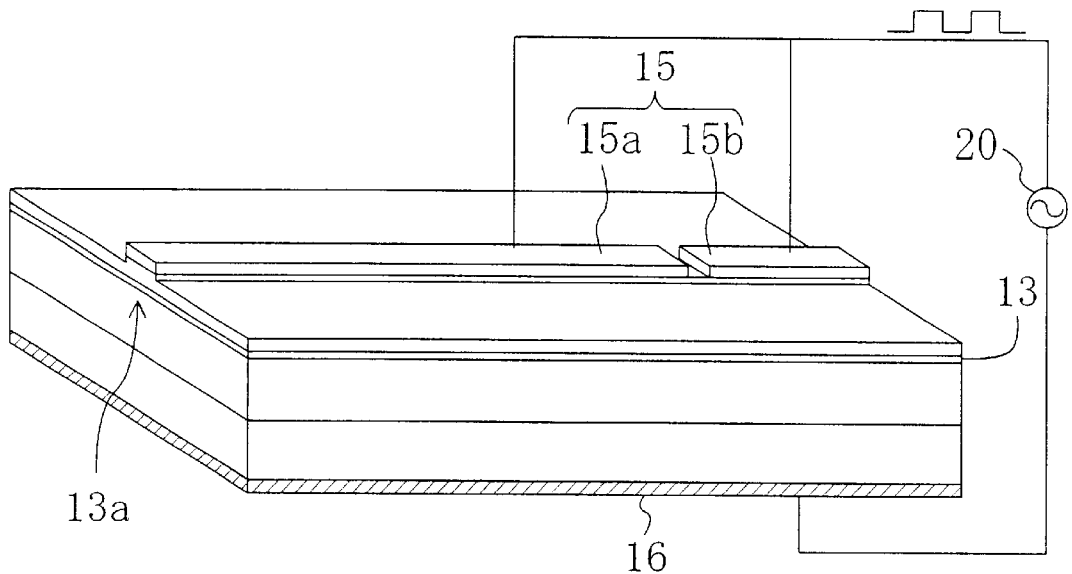
FIGS. 2A and 2B are views illustrating a first method for driving the semiconductor laser device according to the first embodiment of the present invention, FIG. 2A being a schematic perspective view illustrating the laser device in a high operation, FIG. 2B being a schematic perspective view illustrating the laser device operating at low output powers.

Suppose that the semiconductor laser device is used with the pickup in an HD-DVD apparatus. First, described is a method for driving the laser device operating at a high output power that corresponds to the write operation of the apparatus. As shown in FIG. 2A, to operate the laser device at high output powers, a pulsed drive current is applied to both the n-side electrode 16 and the first and second electrode portions 15a, 15b of the p-side electrode 15. This allows the drive current to be injected substantially uniformly into the active layer 13.

Figure 2B:
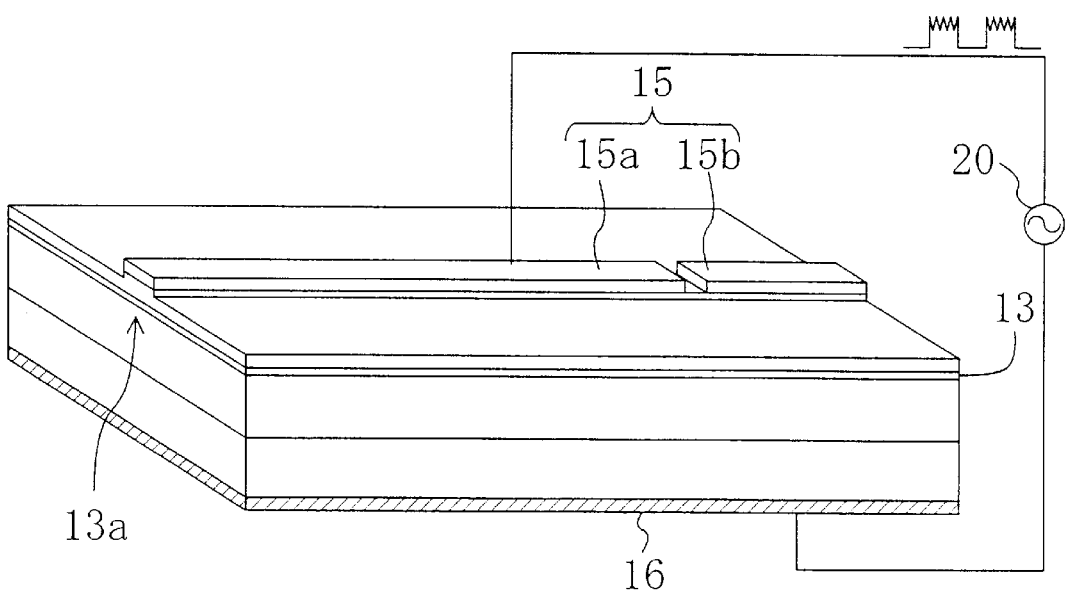

Now, described below is a method for driving the laser device operating at a low output power that corresponds to the read operation of the HD-DVD apparatus. As shown in FIG. 2B, when the laser device operates at low output powers, a signal source 20 applies a pulsed drive current, having a high-frequency signal superimposed thereon, to both the first electrode portion 15a of the p-side electrode 15 and the n-side electrode 16.

In other words, no drive current is applied to the second electrode portion 15b of the p-side electrode 15. The superimposed high-frequency signal may preferably have a frequency of 100 MHz or more, which holds true for the other embodiments.

Such a nonuniform current injection into the active layer 13 causes only the lower portion of the first electrode portion 15a in the active layer 13 to emit light, whereas the lower portion of the second electrode portion 15b in the active layer 13 acts as an optical absorption region. The formation of the optical absorption region causes the multi-mode spectrum line width to be broadened as in the super luminescence diode device, resulting in a reduction in interference characteristic of lased light and thereby making it possible to reduce noise.

Incidentally, the first embodiment has employed as the semiconductor crystal, but is not limited to, a III-V nitride semiconductor of a lasing wavelength of approximately 400 nm. It is also acceptable to use a III-V phosphide semiconductor such as InGaP (indium gallium phosphide) having a lasing wavelength of approximately 670 nm.

However, a laser device that employs a nitride semiconductor has various preferable features as shown below.

That is, since the p-type crystal of the nitride semiconductor has a high resistivity, it is possible to inject current nonuniformly into the active layer 13 in the direction perpendicular to the substrate only by dividing the p-side electrode 15 without electrically isolating the p-type semiconductor portion 14 such as the p-type contact layer.

Furthermore, a phosphide semiconductor and an arsenide semiconductor have a zinc-blende structure whereas the nitride semiconductor has a hexagonal crystal structure. Accordingly, these structures provide electrical properties different from each other in the directions parallel and perpendicular to the principal surface of the substrate. For example, the mobility of carriers is smaller in the direction parallel to the principal surface of the substrate than in the direction perpendicular thereto. Consequently, the nitride semiconductor crystal provides a greater effect of dividing the electrode due to its resistance to the flow of current between the first and second electrode portions 15a and 15b or the divided electrodes.

Furthermore, a GaN-based (gallium nitride based) compound semiconductor provides a considerably higher differential gain than a compound semiconductor that is predominantly composed of InP (indium phosphide) or GaAs (gallium arsenide). This is because gallium nitride has a hexagonal structure and no degeneracy occurs in its holes. As described above, the GaN-based compound semiconductor crystal would be provided with gain or loss in the presence of a slight bias in current distribution due to a high differential gain of the crystal. Consequently, in the laser device employing the GaN-based compound semiconductor, even a slightly nonuniform injection of a drive current into the active layer 13 makes it possible to effectively induce a variation in optical density distribution in the optical waveguide.

[Second Driving Method]

Now, described below is a second method for driving the semiconductor laser device according to the first embodiment of the present invention.

Figure 3:
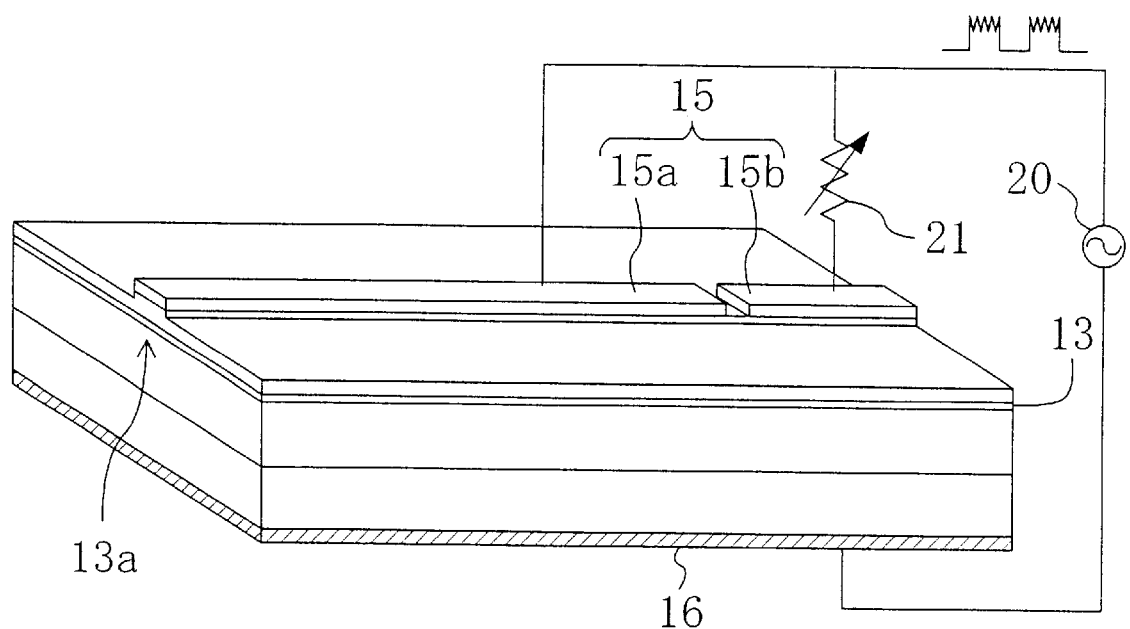
FIG. 3 is a schematic perspective view illustrating a second method for driving the semiconductor laser device according to the first embodiment of the present invention.

As shown in FIG. 3, a variable resistor 21 is connected between the second electrode portion 15b of the p-side electrode 15 and the signal source 20 to apply a pulsed drive current, on which a high-frequency signal is superimposed, from the signal source 20 to the first and second electrode portions 15a, 15b of the p-side electrode 15 and to the n-side electrode 16.

The resistance of the variable resistor 21 is set to around zero for the operation at high output powers while being set to a finite value for the operation at low output powers. Consequently, a uniform drive current is injected into the active layer 13 for the operation at high output powers, whereas a nonuniform drive current is injected into the active layer 13 for the operation at low output powers. As described above, the resistance of the variable resistor 21 is adjusted to control the amount of the drive current applied to the second electrode portion 15b, thereby making it possible to control the amount of absorption of lased light in the active layer 13.

That is, the second electrode portion 15b is formed in an appropriate length and thereafter the resistance of the variable resistor 21 is adjusted to vary the lasing current threshold, thereby making it possible to reduce the relative intensity of noise during the operation at high output powers.

Incidentally, it is preferable that approximately a half or less drive current applied to the first electrode portion 15a is applied to the second electrode portion 15b for the operation at low output powers.

No application of a drive current to the second electrode portion 15b in the first driving method corresponds to the setting of the resistance of the variable resistor 21 to an infinite value in the second driving method.

Furthermore, the variable resistor 21 is connected between the signal source 20 and the second electrode portion 15b in the first embodiment, however, instead of this connection, the variable resistor 21 may be connected between the signal source 20 and the first electrode portion 15a.

Furthermore, the variable resistor 21 has been employed as means for reducing the drive current applied to the second electrode portion 15b of the p-side electrode 15, however, the present invention is not limited thereto but may employ a device or a circuit arrangement having the same function as that of the variable resistor 21.

Furthermore, it is also possible to apply a bias current to a DC signal to thereby control the amount of absorption of lased light in the active layer 13.

[Third Driving Method]

Now, described below is a third method for driving the semiconductor laser device according to the first embodiment of the present invention.

Figure 4:
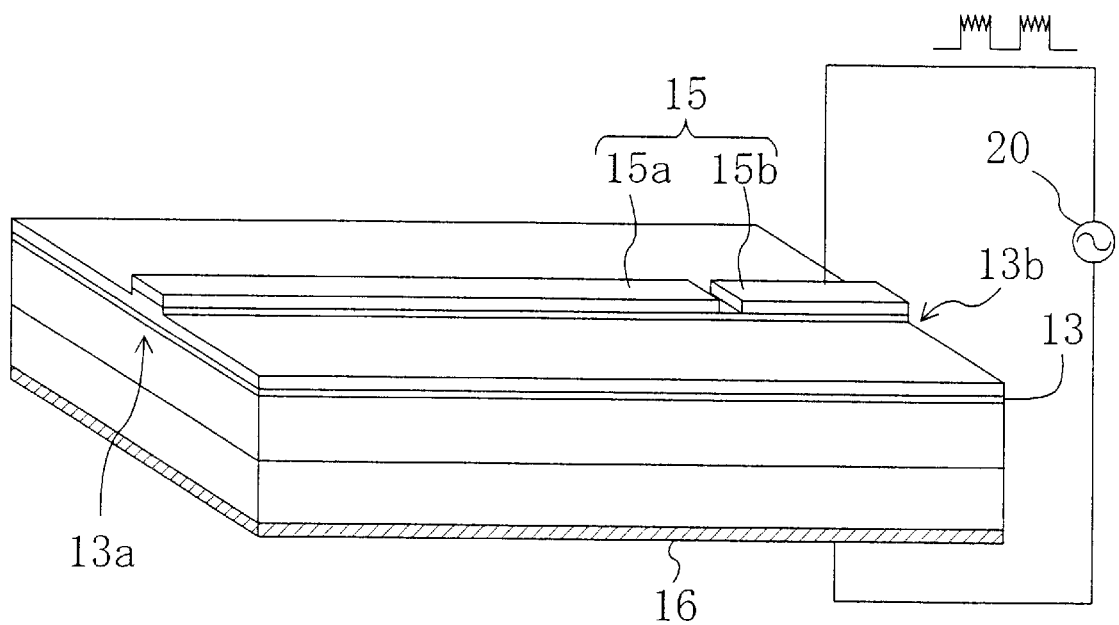
FIG. 4 is a schematic perspective view illustrating a third method for driving the semiconductor laser device according to the first embodiment of the present invention.

As shown in FIG. 4, in the third driving method, a drive current on which a high-frequency signal is superimposed is applied to the second electrode portion 15b instead of applying a drive current to the first electrode portion 15a. This causes the output intensity of the lased light to be reduced on the side of the emitting facet 13a in the active layer 13, thereby making it possible to reduce the deterioration of the emitting facet 13a.

In addition to this, an increased intensity of the lased light at the reflecting facet 13b allows the lasing mode of the laser beam to be stabilized.

On the other hand, unlike the InGaP-based (indium gallium phosphide based) red semiconductor laser device, the GaN-based blue semiconductor laser device has an optically transparent substrate. This causes scattered beams of light from the substrate to be mixed with the emitted light, thereby raising a tendency to increase noise. As in the third driving method, it is possible to apply a drive current to the second electrode portion 15b spaced apart from the side of the emitting facet 13a to reduce the injection current on the side of the emitting facet 13a, thereby reducing the scattered beams of light from the substrate. This prevents the scattered light from being mixed with the emitted light, thereby allowing noise to be reduced.

[Fourth Driving Method]

Now, described below is a fourth method for driving the semiconductor laser device according to the first embodiment of the present invention.

The resonant frequency f of the laser device is expressed by the following equation (1). That is, $$f = 2\pi / \{(R_V + R_S)C\}^{1/2} \quad (1),$$

where $R_V$ is a first resistance value of the portion, acting as an optical absorption layer in the active layer 13, underlying the second electrode portion 15b; $R_S$ is a second resistance value of the portion between the first and second electrode portions 15a, 15b; and C is the capacitance of the laser device.

For example, the second resistance value Rs is 15Ω with the first electrode portion 15a being spaced apart by 1 μm from the second electrode portion 15b and the device capacitance C is 0.8 fF with the second electrode portion 15b being 0.1 mm in length. With the first resistance value Rv being 20Ω, a drive current is applied to the second electrode portion 15b of the p-side electrode 15 and to the n-side electrode 16, thereby inducing the self-pulsation at a resonant frequency of 37 MHz.

The self-pulsation induced as such causes the relative intensity of noise to be reduced without a high-frequency signal being superimposed on the drive current, thereby making it possible to simplify the drive circuit of the laser device.

It has been confirmed that the self-pulsation allows the relative intensity of noise to be reduced to the range from −135 dB/Hz to −110 dB/Hz or less at an optical output power of 1 mW.

Incidentally, the prior-art semiconductor laser device for inducing self-pulsation has a crystal layer for absorbing light where beams of light are distributed, and thus the drive current is not injected nonuniformly as in this embodiment.

[Embodiment 2]

Now, the present invention is described below with reference to the drawings in accordance with a second embodiment.

Figure 5A:
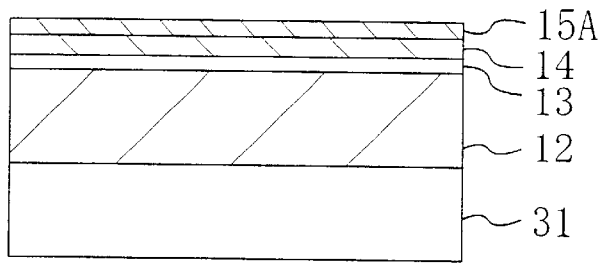
FIGS. 5A to 5C are views illustrating the steps of the method for fabricating the semiconductor laser device according to a second embodiment of the present invention, FIGS. 5A and 5B being cross-sectional views, FIG. 5C being a plan view and a left-side view.
Figure 5B:
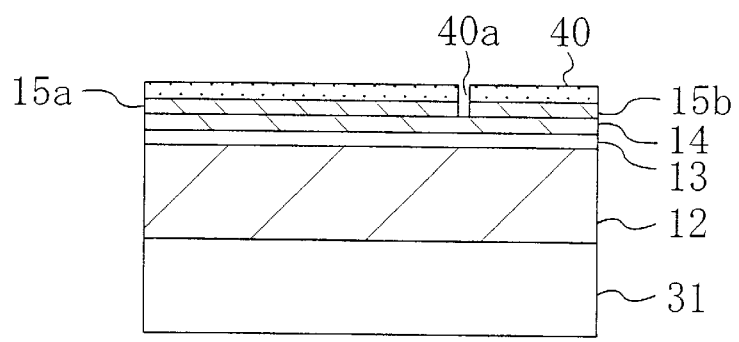
Figure 5C:
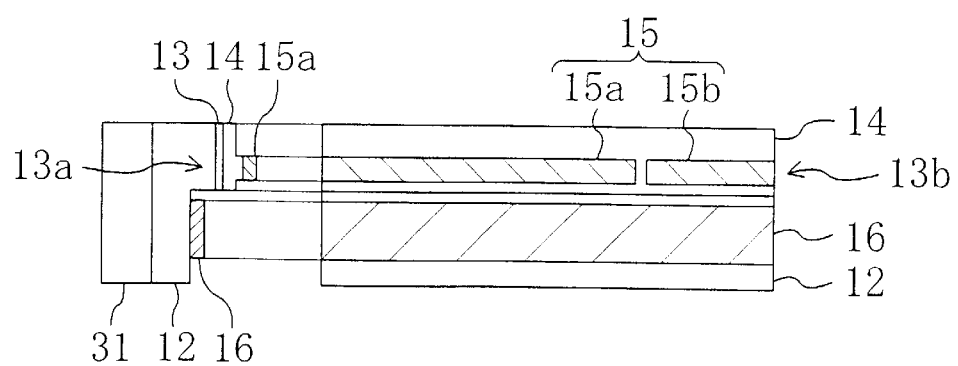

FIGS. 5A to 5C are views illustrating the steps of the method for fabricating the semiconductor laser device according to the second embodiment of the present invention.

First, as shown in the cross-sectional view of FIG. 5A, the n-type semiconductor portion 12, the active layer 13, and the p-type semiconductor portion 14 are successively grown, for example, by MOVPE on a substrate 31 formed of sapphire. The n-type semiconductor portion 12 also contains the following layers that are successively deposited on top of the other in the following order. That is, contained are the n-type contact layer of n-type GaN (gallium nitride), the n-type cladding layer of n-type AlGaN (aluminum gallium nitride), and the n-type guiding layer of n-type GaN (gallium nitride). The p-type semiconductor portion 14 also contains the following layers that are successively deposited on top of the other in the following order. That is, contained are the p-type guiding layer of p-type GaN (gallium nitride), the p-type cladding layer of p-type AlGaN (aluminum gallium nitride), and the p-type contact layer of p-type GaN (gallium nitride).

For example, the active layer 13 is formed of InGaN (indium gallium nitride) or AlGaN (aluminum gallium nitride) which contains compositionally less aluminum than each cladding layer. Subsequently, on the entire surface of the p-type semiconductor portion 14, deposited such as by vapor deposition is a first metal film which is formed of a layered structure of Ni (nickel) and Au (gold) and has a thickness of 100 nm or less.

Then, as shown in the cross-sectional view of FIG. 5B taken in parallel to the region in which the optical waveguide (cavity) is formed, a resist pattern 40 for forming a p-side electrode is formed by photolithography on the first metal film deposited, the resist pattern 40 having a width of approximately 1 µm and an opening 40a in a direction substantially perpendicular to the optical waveguide region. Thereafter, with the formed resist pattern 40 being applied as a mask, the p-side electrode 15 comprising the first and second electrode portions 15a, 15b is formed of the first metal film by dry etching the first metal film using an etching gas that contains chlorine.

Then, as shown in the plan and left-side views of FIG. 5C, the p-type guiding layer is exposed at the regions on both sides of the p-side electrode 15 by dry etching the n-type semiconductor portion 12 using an etching gas that contains chlorine, thereby forming an optical waveguide having the shape of a stripe.

Subsequently, by dry etching using an etching gas that contains chlorine, the n-type contact layer of the p-type semiconductor portion 14 is exposed at the region on a side of the p-side electrode 15. Then, by vapor deposition, a second metal film is deposited which comprises a layered structure of Ti (titanium) and Al (aluminum) and thereafter patterned to form the n-side electrode 16 of the second metal film.

As described above, in the second embodiment, the spacing between the first and second electrode portions 15a, 15b of the p-side electrode 15, or the divided electrodes, needs to be made comparatively as small as approximately 1 µm. The p-side electrode 15 is therefore made 100 nm or less in thickness to facilitate etching. Accordingly, when the semiconductor laser device according to the second embodiment is implemented on a mount member, the p-side electrode 15 is coated with approximately 10 µm of gold plating to prevent the p-side electrode 15 from contacting directly with a soldering material in order to reduce the deterioration of the p-side electrode 15 caused by the soldering material.

Incidentally, in the second embodiment, an insulating substrate 31 is used as the substrate. To use a conductive substrate as in the first embodiment, the n-side electrode 16 may be provided on the reverse surface of the substrate.

[Embodiment 3]

Now, the present invention is described below with reference to the drawings in accordance with a third embodiment.

FIGS. 6A and 6B are schematic perspective views illustrating a semiconductor laser device according to the third embodiment of the present invention and a method for driving the laser device. In FIGS. 6A and 6B the same components as those shown in FIG. 1 are given the same reference numerals and are not repeatedly explained.

As shown in FIG. 6A, for example, the semiconductor laser device according to the third embodiment employs the insulating substrate 31 formed of sapphire. Like in the first embodiment, on the principal surface of the substrate 31, formed by MOVPE are the n-type semiconductor portion 12, the active layer (light-emitting layer) 13, and the p-type semiconductor portion 14.

In the third embodiment, the p-side electrode 15 having the shape of a stripe is not divided. Instead, a region of the n-type semiconductor portion 12 on one side of the p-side electrode 15 is etched to expose the n-type contact layer. The n-side electrode 16 is formed on the exposed region to employ the n-side electrode 16 as a divided electrode.

That is, the n-side electrode 16 is a divided electrode that consists of a first electrode portion 16a formed on the side of the emitting facet 13a of the active layer 13 and a second electrode portion 16b, formed on the side of the reflecting facet 13b.

Since the n-type semiconductor portion 12 is lower in resistance than the p-type semiconductor portion 14, dividing the n-side electrode 16 instead of the p-side electrode 15 makes it possible to inject a uniform drive current into the active layer 13 even with the first electrode portion 16a being spaced apart approximately 10 µm from the second electrode portion 16b.

Accordingly, unlike the first and second electrode portions 15a, 15b of the p-side electrode 15 according to the first embodiment, it is not necessary to set the spacing between the electrode portions 15a, 15b to such an extremely small value as 1 µm. This makes the laser device resistant to deterioration in optical and electrical properties as well as facilitates the formation of the divided electrode.

Now, a voltage drop V between the electrode portions 16a, 16b is expressed by the following equation (2). That is, $$V = 0.6I \cdot d \quad (2),$$

where the resistivity of the n-type contact layer in the n-type semiconductor portion 12 is 0.015 Ωcm, d(µm) is the spacing between the first electrode portion 16a and the second electrode portion 16b, and I(A) is the current injected into one of the first electrode portion 16a and the second electrode portion 16b.

This equation holds because the n-type semiconductor portion 12 as small as approximately 2 µm in thickness causes an appropriate voltage drop to develop between the electrode portions 16a, 16b. Accordingly, for example, suppose that the injection current is 100 mA and the spacing between the electrode portions 16a, 16b is 1 µm. In this case, the voltage drop V is 0.06V, which is not sufficient for the laser device to operate at low output powers.

Now, the first electrode portion 16a of the n-side electrode 16 is spaced apart by 5 µm from the second electrode portion 16b. This give a voltage drop V of 0.3V, thereby making it possible to restrict the current flowing through the region between the electrode portions 16a, 16b. Consequently, this makes it possible to inject a drive current nonuniformly into the active layer 13 in the direction perpendicular to the substrate surface.

It is further preferable that the first electrode portion 16a is spaced apart by 10 µm or more from the second electrode portion 16b to give a voltage drop V of 0.6V or more. Suppose also that no current is injected into one of the first and second electrode portions 16a, 16b. In this case, the spacing between the electrode portions 16a, 16b has to be 20 µm or more to provide a voltage drop V of 1.2V or more.

Now, the operation of the semiconductor laser device configured as described above is explained with reference to the drawings.

First, described below is a method for driving the semiconductor laser device operating at high output powers. As shown in FIG. 6A, for the operation at high output powers, a pulsed drive current is applied to the p-side electrode 15 and to the first and second electrode portions 16a, 16b of the n-side electrode 16. This allows the drive current to be injected substantially uniformly into the active layer.

On the other hand, as shown in FIG. 6B, for the operation at low output powers, a variable resistor 21 is connected between the second electrode portion 16b of the n-side electrode 16 and the signal source 20 to apply a pulsed drive current, on which a high-frequency signal is superimposed, from the signal source 20 to the p-side electrode 15 and to the first and second electrode portions 16a, 16b of the n-side electrode 16. At this time, with the variable resistor 21 being provided with a finite resistance, a second drive current, smaller in amplitude than the first drive current applied to the first electrode portion 16a, is applied to the second electrode portion 16b. However, depending on the output intensity of the laser beam, the second drive current may be substantially zero.

Wherein, the structure shown in FIG. 6A corresponds to a case that the resistance of the variable resistor 21 is set to 0 in FIG. 6B.

Like in the first embodiment, this makes it possible to reduce the relative intensity of noise during the operation at low output powers.

Incidentally, in the third embodiment, the variable resistor 21 may also be connected between the signal source 20 and the first electrode portion 16a.

Furthermore, the variable resistor 21 has been provided between the second electrode portion 16b of the n-side electrode 16 and the signal source 20. However, it is also acceptable to employ a device or a circuit arrangement having the same function as that of the variable resistor 21.

Furthermore, instead of employing an AC signal as the drive current, it is also possible to apply a bias current to a DC signal to thereby control the amount of absorption of lased light in the active layer 13.

Furthermore, for the operation at low output powers, the third driving method described in the first embodiment may be employed in which a drive current is applied to the second electrode portion 16b instead of the first electrode portion 16a.

Still furthermore, the fourth driving method shown in the first embodiment may be employed for self-pulsation.

[Fabrication Method]

Now, explained below is a method for fabricating the semiconductor laser device, configured as described above, with reference to the drawings.

FIGS. 7A to 7E are views illustrating the structure of the semiconductor laser device in each step of the method for fabricating the laser device according to the third embodiment of the present invention.

Figure 7A:
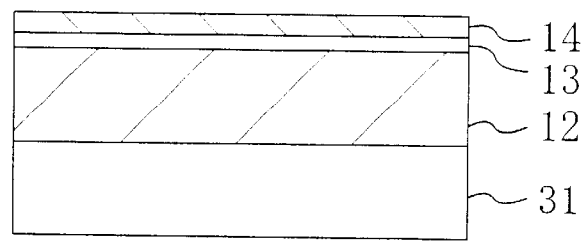
FIGS. 7A to 7E are views illustrating the structure of the semiconductor laser device in each step of the method for fabricating the laser device according to the third embodiment of the present invention, FIG. 7A being a cross-sectional view, FIG. 7B being a plan view, FIG. 7C being a plan view and a left-side view, and FIGS. 7D and 7E being plan views.

First, as shown in the cross-sectional view of FIG. 7A, the n-type semiconductor portion 12, the active layer 13, and the p-type semiconductor portion 14 are successively grown, for example, by MOVPE on the substrate 31 formed of sapphire. The n-type semiconductor portion 12 also contains the following layers that are successively deposited on top of the other in the following order. That is, contained are the n-type contact layer of n-type GaN (gallium nitride), the n-type cladding layer of n-type AlGaN (aluminum gallium nitride), and the n-type guiding layer of n-type GaN (gallium nitride).

The p-type semiconductor portion 14 also contains the following layers that are successively deposited on top of the other in the following order. That is, contained are the p-type guiding layer of p-type GaN (gallium nitride), the p-type cladding layer of p-type AlGaN (aluminum gallium nitride), and the p-type contact layer of p-type GaN (gallium nitride).

For example, the active layer 13 is formed of InGaN (indium gallium nitride) or AlGaN (aluminum gallium nitride) which contains compositionally less aluminum than each cladding layer.

Figure 7B:
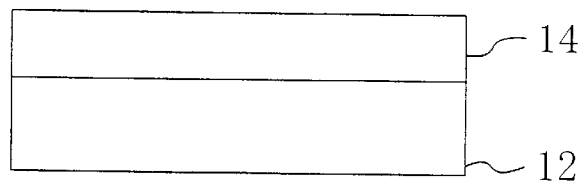

Then, as shown in the plan view of FIG. 7B, the n-type contact layer of the n-type semiconductor portion 12 is dry etched, using an etching gas that contains chlorine, to expose along the optical waveguide formation region.

Figure 7C:
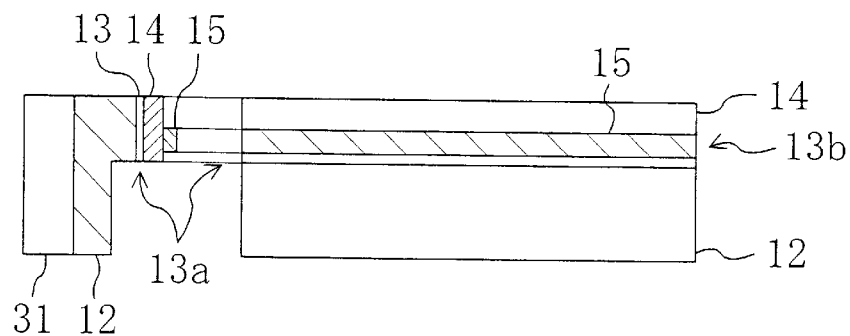

Subsequently, as shown in the plan and left-side views of FIG. 7C, on the optical waveguide formation region on the p-type semiconductor portion 14, deposited such as by vapor deposition and etching is the p-side electrode 15 which is formed of a layered structure of Ni (nickel) and Au (gold) and has a width of approximately 1.8 µm to 2.5 µm. Incidentally, in this step, a first metal film for forming a p-side electrode has been formed by vapor deposition after the etching step for exposing the n-type contact layer. Instead of this step, a first metal film for forming a p-side electrode is formed by vapor deposition, and thereafter the patterning of the p-side electrode 15 and the etching for exposing the n-type contact layer may be successively carried out.

Figure 7D:
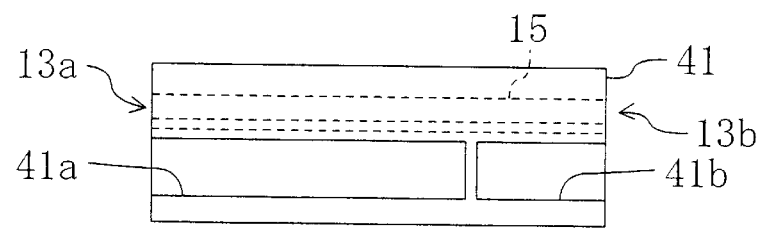

Then, as shown in the plan view of FIG. 7D, a resist pattern 41 for forming the n-side electrode is formed by photolithography on the exposed region of the n-type semiconductor portion 12, the resist pattern 41 having a first opening 41a on the side of the emitting facet 13a and a second opening 41b on the side of the reflecting facet 13b.

Figure 7E:
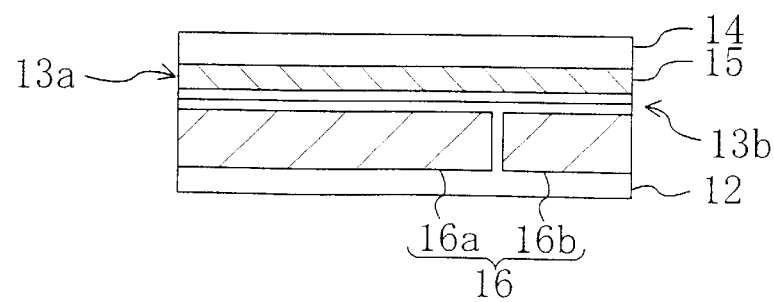

Then, as shown in the plan view of FIG. 7E, on the resist pattern 41, deposited such as by vapor deposition is a second metal film of a layered structure of Ti (titanium) and Al (aluminum) to lift off the resist pattern 41. The n-side electrode 16 is thereby formed of the deposited second metal film, the n-side electrode 16 consisting of the first and second electrode portions 16a, 16b which are spaced apart by a predetermined amount from each other.

As described above, for the semiconductor laser device according to the third embodiment, the spacing between the electrode portions 16a, 16b of the divided electrode being relatively as large as approximately 10 µm allows the lift-off method to be employed, which can be easily used for fabrication.

[A Modified Example of Embodiment 3]

Now, the planar shape of the n-side electrode 16 according to a modified example of the third embodiment is described below with reference to the drawings.

Figure 8A:
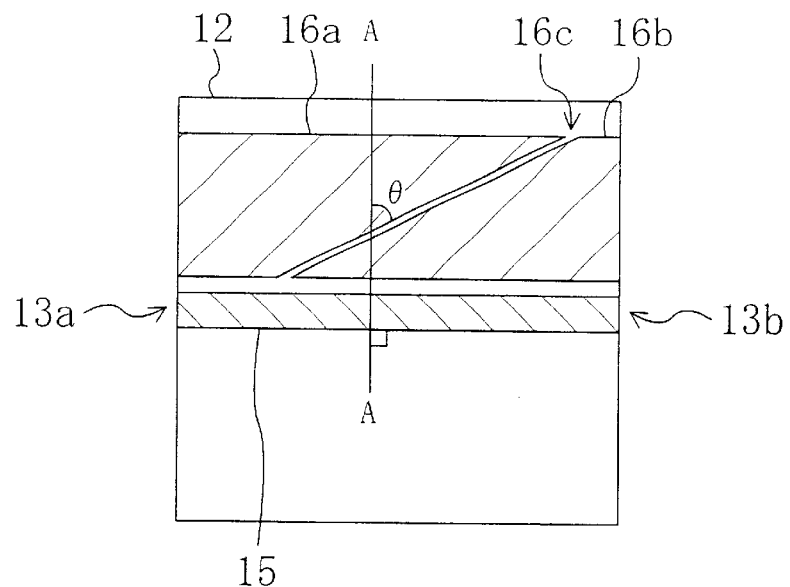
FIGS. 8A and 8B are plan views illustrating a semiconductor laser device of a modified example according to the third embodiment of the present invention.

FIG. 8(a) illustrates the planar structure of a semiconductor laser device according to a modified example of the third embodiment. As shown in FIG. 8(a), a dividing region 16c is disposed between the first and second electrode portions 16a, 16b of the n-side electrode 16. The dividing region 16c is formed in the direction orthogonal in the substrate plane to the longitudinal direction (along the stripe) of the p-side electrode 15, that is, at a predetermined angle of inclination θ (where 0<θ<90°) to line A—A.

The semiconductor laser device according to the third embodiment has the n-side electrode 16 which is provided on the side of the optical waveguide (cavity). As shown in FIG. 6A, suppose that the dividing region 16c between the electrode portions 16a, 16b of the n-side electrode 16 is disposed orthogonal to the direction in which the p-side electrode 15 extends. In this case, upon applying a drive current to both the first and second electrode portions 16a, 16b of the n-side electrode 16 for the operation at high output powers, there is a possibility of creating a region through which no drive current is injected into the active layer 13 (the n-type contact layer).

In this context, this modified example is adapted such that the dividing region 16c between the electrode portions 16a, 16b of the n-side electrode 16 is disposed at angles of inclination greater than 0° and less than 90° in the direction perpendicular in the substrate plane to the longitudinal direction of the p-side electrode 15. This allows the first and second electrode portions 16a, 16b to appear at least once along line A—A in the dividing region 16c, thereby creating no region through which no drive current is injected into the active layer 13.

Figure 8B:
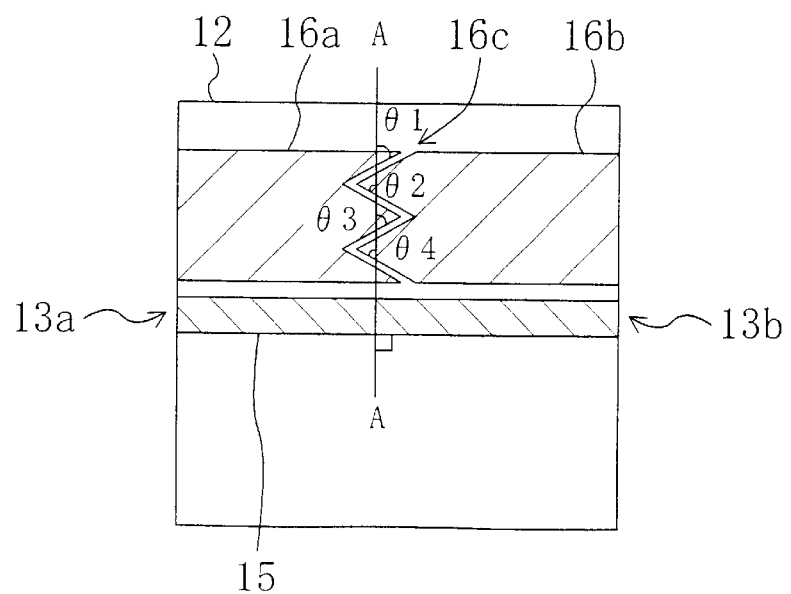

Incidentally, as shown in FIG. 8(b), the dividing region 16c may be formed in a zigzag shape, for example, having angles of inclination of θ1 to θ4. Accordingly, including the case of FIG. 8(a), one of a plurality of angles of inclination may be greater than 0° and less than 90° to form the dividing region 16c in the shape of a zigzag line. In addition, the dividing region 16c is not limited to FIGS. 8A and 8B, but may be formed in a curved shape.

In general, a laser device employing a GaN-based compound semiconductor has a hexagonal crystal structure and therefore will be provide with an increased gain and thereby improved lasing characteristics when uniaxial strain is introduced into the optical waveguide.

Accordingly, as in the third embodiment, an electrode can be provided on the side of the optical waveguide to thereby introduce uniaxial strain effectively, making it possible to improve the optical characteristics of the laser device.

Furthermore, as in the third embodiment, the n-type semiconductor portion 12 is approximately 2 μm in thickness to form a laser structure using the substrate 31 having an insulative property. Consequently, when compared with a conductive substrate, the insulative substrate 31 makes it possible to prevent the injected current from diffusing into the n-type semiconductor portion 12. For this reason, the divided n-side allows a drive current to be injected nonuniformly into the active layer 13 in the direction perpendicular to the substrate surface.

[Embodiment 4]

Now, described below is a fourth embodiment of the present invention with reference to the drawings.

Figure 10:
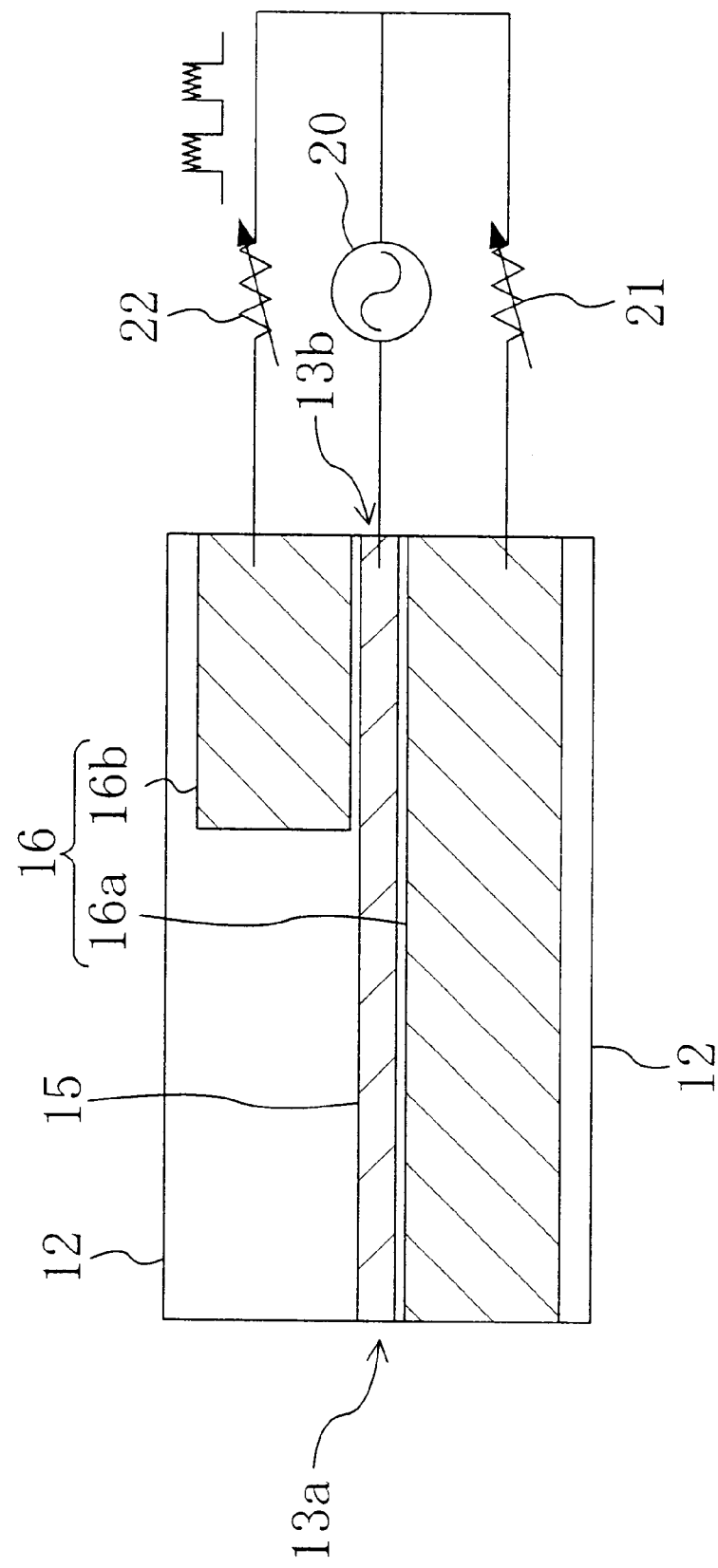
FIG. 10 is a schematic view illustrating a semiconductor laser device according to the fourth embodiment of the present invention and a second method for driving the laser device.

FIGS. 9A and 9B, and FIG. 10 are schematic perspective views illustrating a semiconductor laser device according to the fourth embodiment of the present invention and a method for driving the laser device. In FIGS. 9A and 9B, and FIG. 10, the same components as those shown in FIG. 6A are given the same reference numerals.

In the third embodiment described above, the first and second electrode portions 16a, 16b of the n-side electrode 16 are formed on the region at one side of the p-side electrode 15.

In the fourth embodiment, the regions of the n-type semiconductor portion 12 on both sides of the p-side electrode 15 are exposed, where the first electrode portion 16a is formed substantially on the entire surface of one of the regions. The second electrode portion 16b is formed on part of the other exposed region, for example, on the side of the reflecting facet 13b. In other words, the first and second electrode portions 16a, 16b are arranged asymmetrically in their planar shapes with respect to the p-side electrode 15.

This arrangement is made possible from the fact that an insulative substrate formed of sapphire is employed as the substrate, and both the p-side electrode 15 and the n-side electrode 16 are formed on the same surface of the substrate.

Furthermore, unlike the third embodiment, it is not necessary to perform the patterning for determining the width and shape of the dividing region 16c in order to form the n-side electrode 16 consisting of the first and second electrode portions 16a, 16b of the conductive film deposited on one exposed region.

Now, the operation of the semiconductor laser device arranged as described above is explained below with reference to the drawings.

[First Driving Method]

First, described is a first method for driving the semiconductor laser device according to the fourth embodiment of the present invention. As shown in FIG. 9A, to operate the laser device at high output powers, a pulsed drive current is applied to both the p-side electrode 15 and the first electrode portion 16a of the n-side electrode 16. This allows the drive current to be injected uniformly into the active layer.

On the other hand, as shown in FIG. 9B, to operate the laser device at high output powers, a pulsed drive current on which a high-frequency signal is superimposed is applied from the signal source 20 to both the p-side electrode 15 and the second electrode portion 16b of the n-side electrode 16. This allows the drive current to be injected nonuniformly into the active layer.

[Second Driving Method]

Now, described below is a second method for driving the semiconductor laser device according to the fourth embodiment of the present invention.

As shown in FIG. 10, a first variable resistor 21 is connected between the signal source 20 and the first electrode portion 16a of the n-side electrode 16, and a second variable resistor 22 is connected between the signal source 20 and the second electrode portion 16b of the n-side electrode 16.

For the operation at high output powers, the resistance of the first variable resistor 21 is set to around zero, whereas the resistance of the second variable resistor 22 is set so as not to allow a current to flow through the second electrode portion 16b. In this condition, a pulsed drive current on which a high-frequency signal is superimposed is supplied from the signal source 20. Consequently, a uniform drive current is injected into the active layer 13 during the operation at high output powers.

On the other hand, for the operation at low output powers, the resistance of the first variable resistor 21 is set so as not to allow a current to flow through the first electrode portion 16a, whereas the resistance of the second variable resistor 22 is set to around zero. In this condition, a pulsed drive current on which a high-frequency signal is superimposed is supplied from the signal source 20. Consequently, a nonuniform drive current is injected into the active layer 13 during the operation at low output powers.

As described above, the amount of the drive current applied to the first electrode portion 16a is adjusted by means of the first variable resistor 21, while the amount of the drive current applied to the second electrode portion 16b is adjusted by means of the second variable resistor 22. This makes it possible to control the amount of absorption of lased light in the active layer 13. This in turn allows the relative intensity of noise to be reduced during the operation at high output powers.

Incidentally, in the first driving method, the operation at high output powers corresponds to the setting of the resistance of the second variable resistor 22 to an infinite value, whereas the operation at low output powers corresponds to the setting of the resistance of the first variable resistor 21 to an infinite value. Wherein, switch elements may be provided in lieu to the first and second variable resistors 21, 22, respectively.

Furthermore, the variable resistors have been used as means for reducing the amount of the drive current. However, it is also acceptable to employ a device or a circuit arrangement having the same function as that of the variable resistors.

Furthermore, instead of employing a pulsed AC signal as the drive current, it is also possible to apply a bias current to a DC signal to thereby control the amount of absorption of lased light in the active layer.

Furthermore, the fourth driving method shown in the first embodiment may be employed for self-pulsation.

[A Modified Example of Embodiment 4]

Now, the present invention is described below in accordance with a modified example of the fourth embodiment with reference to the drawings.

Figure 11:
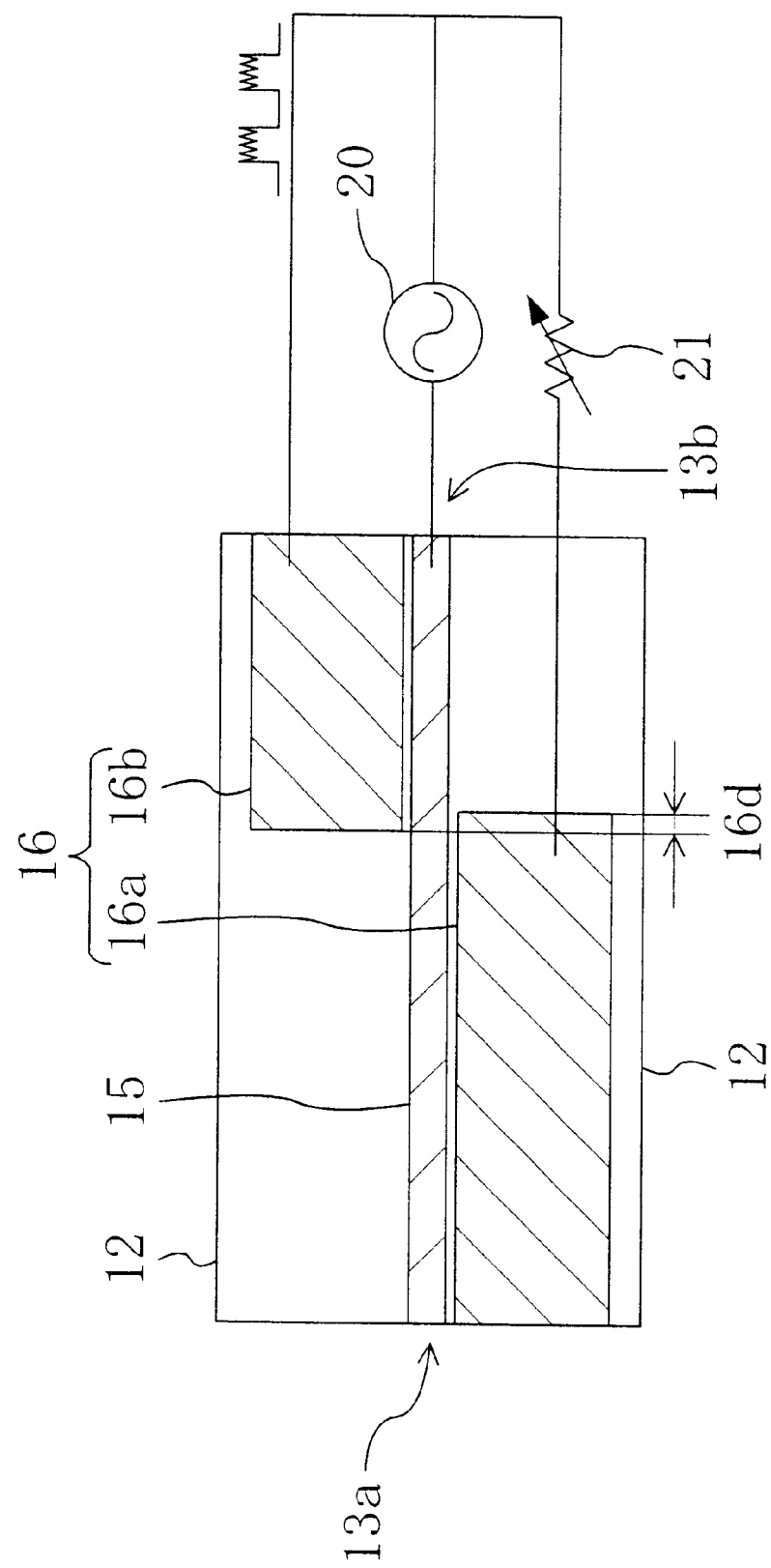
FIG. 11 is a schematic plan view illustrating a semiconductor laser device of a modified example according to the fourth embodiment of the present invention and a method for driving the laser device.

FIG. 11 illustrates schematically the semiconductor laser device according to the modified example of the fourth embodiment of the present invention and the method for driving the laser device. In FIG. 11, the same components as those shown in FIG. 10 are given the same reference numerals.

This modified example is adapted such that the first electrode portion 16a of the n-side electrode 16 is not disposed at the portion opposite to the second electrode portion 16b with the p-side electrode 15 being interposed therebetween.

This obviates the need to provide the second variable resistor 22 between the second electrode portion 16b and the signal source 20.

The method for driving the semiconductor laser device according to the modified example is carried out as follows. That is, first, the resistance of the first variable resistor 21 is set to around zero for the operation at high output powers while being set to a finite value for the operation at low output powers. Then, a pulsed drive current on which a high-frequency signal is superimposed is applied from the signal source 20 to the first and second electrode portions 16a, 16b of the n-side electrode 16.

In this modified example, the first and second electrode portions 16a, 16b of the n-side electrode 16 are arranged asymmetrically in their planar shapes with respect to the p-side electrode 15.

In addition to this, the first and second electrode portions 16a, 16b are adapted such that each have an overlapping portion 16d that overlaps the other at their ends adjacent to each other in a direction perpendicular to the p-side electrode 15 in the plane thereof. This makes it possible to create a region through which the drive current is not injected into the active layer even when the drive current is applied simultaneously to the first and second electrode portions 16a, 16b for the operation at high output powers. This ensures the uniformity of the laser beam for the operation at high output powers.

[Embodiment 5]

Now, the present invention is described below in accordance with a fifth embodiment with reference to the drawings.

Figure 12:
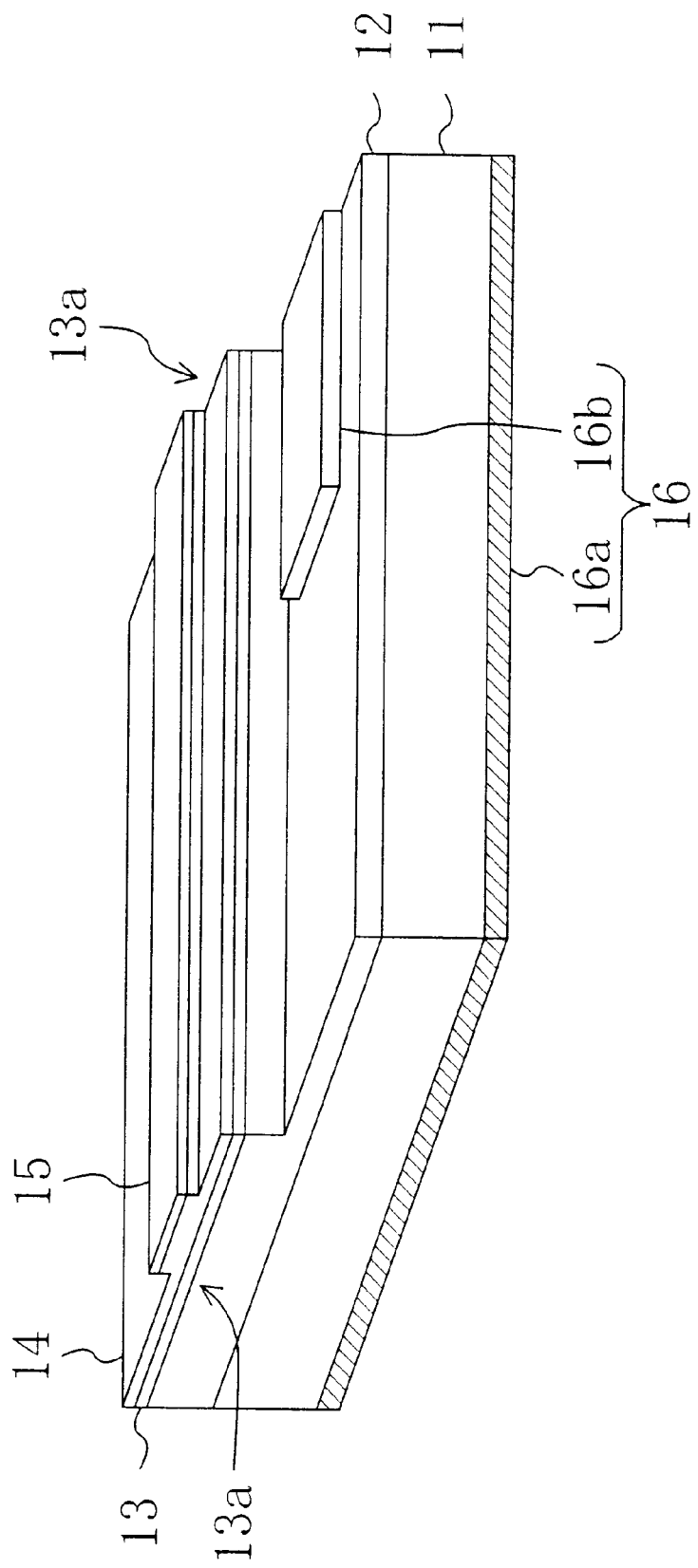
FIG. 12 is a perspective view illustrating a semiconductor laser according to a fifth embodiment of the present invention.

FIG. 12 illustrates a semiconductor laser device according to the fifth embodiment of the present. In FIG. 12, the same components as those shown in FIG. 1 are given the same reference numerals.

The fifth embodiment employs a conductive substrate formed of a material such as GaN (gallium nitride) as the semiconductor substrate 11. Since the semiconductor substrate 11 is conductive, the first electrode portion 16a of the n-side electrode 16 for injecting a uniform current into the active layer 13 is formed substantially on the entire reverse surface of the semiconductor substrate 11. The fifth embodiment is thus provided with a divided electrode that consists of the second electrode portion 16b disposed on the surface of the principal surface of the semiconductor substrate 11 and the first electrode portion 16a disposed on the reverse surface of the semiconductor substrate 11.

Figure 14:
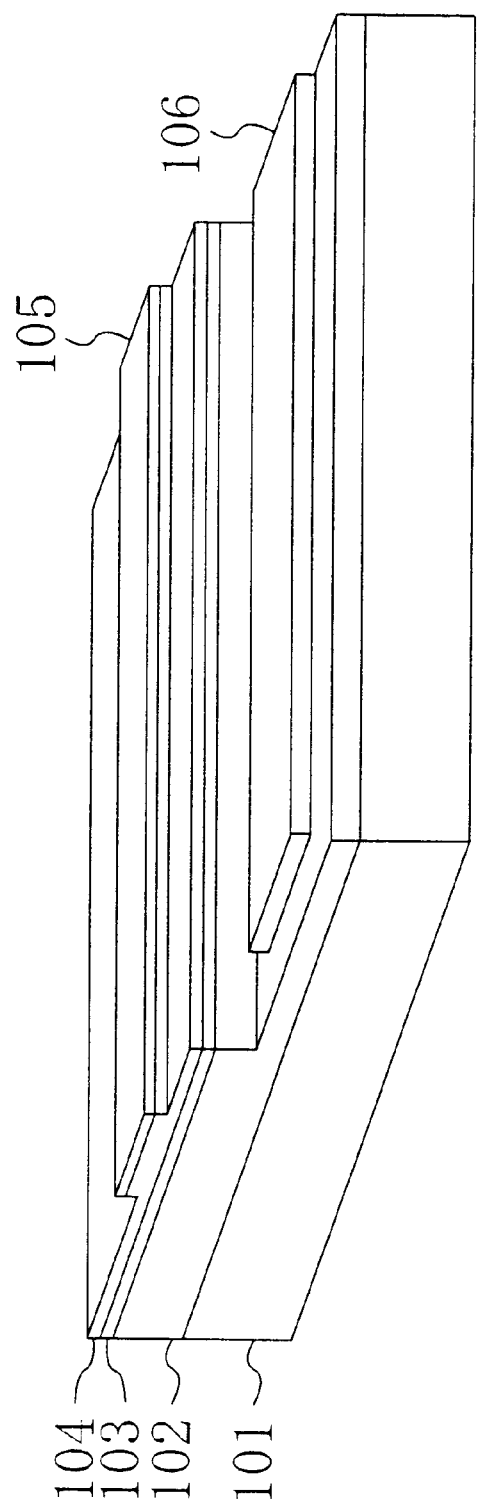
FIG. 14 is a perspective view illustrating a prior-art semiconductor laser device.

The semiconductor substrate 11 is provided, on the principal surface thereof, with two electrodes, one being the p-side electrode 15 and the other being the second electrode portion 16b of the n-side electrode 16. This arrangement is substantially equal to that of the prior-art semiconductor laser device shown in FIG. 14. Consequently, the prior-art sub-mount can be used to mount the p-side electrode 15 on the upper surface of the sub-mount in a so-called p-side-down (junction-down) manner, thereby fabricating the semi-conductor laser device. Accordingly, the semiconductor laser device according to the fifth embodiment can be realized in an electrode-divided structure having the n-side electrode 16 divided, after having been implemented on the sub-mount in the p-side-down manner and provided with traces on the first electrode portion 16a of the n-side electrode 16 on the reverse surface of the semiconductor substrate 11.

[Fabricating Method]

Now, a method for fabricating the semiconductor laser device configured as described above is explained below with reference to the drawings.

FIGS. 13A to 13D are views illustrating the structure of the semiconductor laser device in each step of the method for fabricating the laser device according to the fifth embodiment of the present invention.

Figure 13A:
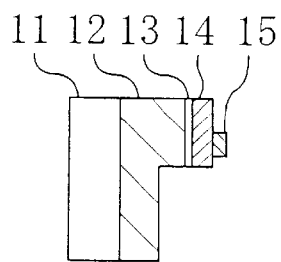
FIGS. 13A to 13D are views illustrating the structure of the semiconductor laser device in each step of the method for fabricating the laser device according to the fifth embodiment of the present invention, FIG. 13A being a plan view and a left-side view, FIGS. 13B and 13C being plan views, and FIG. 13D being a left-side view.

As shown in the plan and left-side views of FIG. 13A, like in the third embodiment, an n-type contact layer is first exposed at the region on one side of the optical waveguide formation region in the n-type semiconductor portion 12 as well as the p-side electrode 15 is patterned in the shape of a stripe on the n-type semiconductor portion 12.

Figure 13B:
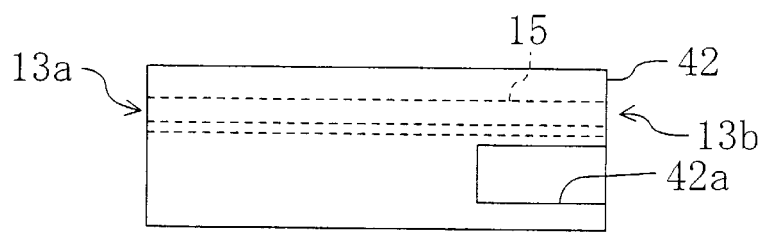

As shown in the plan view of FIG. 13B, a resist pattern 42 for forming the n-side electrode is formed by photolithography, the resist pattern 42 having an opening 42a on the exposed region of the n-type semiconductor portion 12 at the side of the reflecting facet 13b.

Figure 13C:
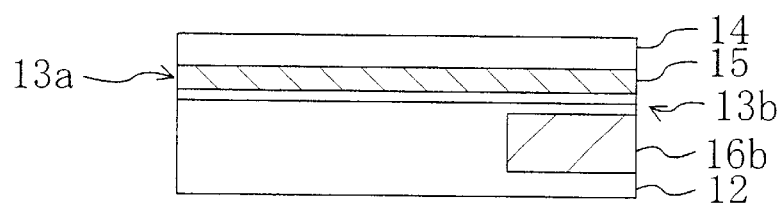

Then, as shown in the plan view of FIG. 13C, on the resist pattern 42, deposited such as by vapor deposition is a metal film of a layered structure of Ti and Al to lift off the resist pattern 42. The second electrode portion 16b of the n-side electrode 16 is thereby formed of the deposited metal film.

Figure 13D:
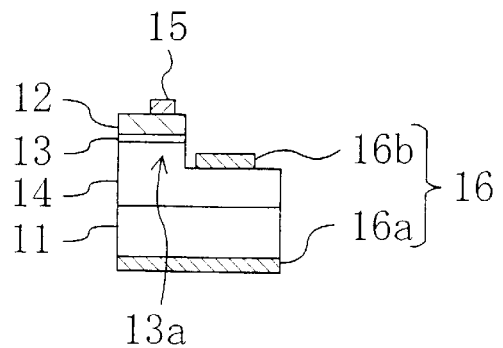

Then, as shown in the plan view of FIG. 13D, the reverse surface of the semiconductor substrate 11 is polished to a thickness of approximately 100 µm. Then, by vapor deposition or the like, a layered structure of Ti and Al is deposited on the entire reverse surface to form the first electrode portion 16a of the n-side electrode 16.

Incidentally, the first to fifth embodiments have been explained with reference to the semiconductor laser device that is employed for the pickup of an optical disc apparatus, however, the present invention is not limited thereto. That is, the semiconductor laser device according to the present invention may be used for those applications in which the laser device has to provide lased light of high output intensity for the operation at high output powers and lased light of low output intensity for the operation at low output powers.

What is claimed is:

1. A method for driving a semiconductor light-emitting device, said semiconductor light-emitting device comprising
a first semiconductor layer of a first conductivity type formed on a substrate,
a second semiconductor layer of a second conductivity type formed on said first semiconductor layer,
an active layer, formed between said first semiconductor layer and said second semiconductor layer, for generating emission light emitted from an emitting facet comprising a side of said active layer,
a first electrode for supplying a drive current to said first semiconductor layer, and
a second electrode, having the shape of a stripe, for supplying a drive current to said second semiconductor layer,
wherein said first electrode or said second electrode is a divided electrode divided in the longitudinal direction of said second electrode, and
said divided electrode comprising a first electrode portion located on the side of an emitting facet and a second electrode portion located on the side of a reflecting facet,
said method comprising the steps of:
to increase a relative lasing output of a laser beam, applying a first drive current comprising a pulsed AC signal to said first electrode portion and said second electrode portion, and
to decrease a relative lasing output of a laser beam, applying a drive current comprising an AC signal having a high-frequency signal superimposed thereon to said first electrode portion as well as one of applying a second drive current to said second electrode portion and applying no second drive current to said second electrode portion, the second drive current being less in magnitude than said first drive current, or alternatively, applying a drive current comprising an AC signal having a high-frequency signal superimposed thereon to said second electrode portion as well as one of applying said second drive current to said first electrode portion and applying no second drive current to said first electrode portion, said second drive current being less in magnitude than said first drive current.

2. The method for driving a semiconductor light-emitting device according to claim 1, wherein said first drive current is allowed through resistance varying means to generate said second drive current.

3. The method for driving a semiconductor light-emitting device according to claim 1, wherein the peak value of said second drive current is approximately one half the peak value of said first drive current.

4. A method for driving a semiconductor light-emitting device, said semiconductor light-emitting device comprising
a first semiconductor layer of a first conductivity type formed on a substrate,
a second semiconductor layer of a second conductivity type formed on said first semiconductor layer,
an active layer, formed between said first semiconductor layer and said second semiconductor layer, for generating emission light emitted from an emitting facet comprising a side of said active layer,
a first electrode for supplying a drive current to said first semiconductor layer, and
a second electrode, having the shape of a stripe, for supplying a drive current to said second semiconductor layer,
wherein said first electrode or said second electrode is a divided electrode divided at an obverse surface and a reverse surface of said substrate, and
said divided electrode comprising a first electrode portion which covers almost all of a surface of said substrate opposite to a surface of said active layer and a second electrode portion located on the emitting face side or the reflecting facet side on said first semiconductor layer,
said method comprising the steps of:
to increase a relative lasing output of a laser beam, applying a first drive current comprising a pulsed AC signal to said first electrode portion, and
to decrease a relative lasing output of a laser beam, applying a drive current comprising an AC signal having a high-frequency signal superimposed thereon to said second electrode portion, and one of applying a second drive current to said first electrode portion and applying no second drive current to said second electrode portion, said second drive current being less in magnitude than said first drive current.

5. The method for driving a semiconductor light-emitting device according to claim 1, wherein, said first drive current is substantially evenly injected into said active layer.

6. The method for driving a semiconductor light-emitting device according to claim 1, wherein said different drive currents are unevenly injected into said active layer.

7. The method for driving a semiconductor light-emitting device according to claim 6, wherein, to decrease a relative lasing output of a laser beam, the active layer in the lower portion of said second electrode portion comprises a light absorption region.

* * * * *